(12) United States Patent
Sinanoglu

(10) Patent No.: US 8,756,468 B2
(45) Date of Patent: Jun. 17, 2014

(54) ARCHITECTURE, SYSTEM, METHOD, AND COMPUTER-ACCESSIBLE MEDIUM FOR TOGGLE-BASED MASKING

(75) Inventor: Ozgur Sinanoglu, New York, NY (US)

(73) Assignee: New York University, New York, NY (US)

(*) Notice: Subject to any disclaimer, the term of this patent is extended or adjusted under 35 U.S.C. 154(b) by 203 days.

(21) Appl. No.: 13/459,847

(22) Filed: Apr. 30, 2012

(65) Prior Publication Data
US 2012/0278672 A1 Nov. 1, 2012

Related U.S. Application Data

(60) Provisional application No. 61/480,194, filed on Apr. 28, 2011.

(51) Int. Cl.
*G01R 31/28* (2006.01)
(52) U.S. Cl.
USPC .......................................... 714/729; 714/727

(58) Field of Classification Search
USPC ......................... 714/726, 732, 733, 729, 727
See application file for complete search history.

(56) References Cited

U.S. PATENT DOCUMENTS

| | | | |
|---|---|---|---|
| 7,032,148 B2* | 4/2006 | Wang et al. | 714/729 |
| 7,370,254 B2* | 5/2008 | Rajski et al. | 714/726 |
| 8,166,359 B2* | 4/2012 | Rajski et al. | 714/732 |
| 8,522,097 B2* | 8/2013 | Kim et al. | 714/733 |
| 2013/0173979 A1* | 7/2013 | Goessel et al. | 714/727 |

* cited by examiner

*Primary Examiner* — David Ton
(74) *Attorney, Agent, or Firm* — Andrews Kurth LLP

(57) ABSTRACT

Exemplary embodiments of the present disclosure include apparatus, methods, and computer-accessible medium for a toggle-masking procedure configured to mask, e.g., most or all the unknown x's and minimizing the over-masked known bits for clustered distribution of unknown bits. According to certain exemplary embodiments, it is possible to obtain previous masking information regarding the scan chain(s) associated with a previous cycle, and mask the scan chain(s) for a present cycle based on the previous masking information.

22 Claims, 9 Drawing Sheets

ARCHITECTURE, SYSTEM, METHOD, AND COMPUTER-ACCESSIBLE MEDIUM FOR TOGGLE-BASED MASKING

CROSS-REFERENCE TO RELATED APPLICATION(S)

This application claims priority from U.S. Provisional Patent Application No. 61/480,194, filed on Apr. 28, 2011, which is hereby incorporated by reference in its entirety.

FIELD OF DISCLOSURE

Exemplary embodiments of the present disclosure relate to testing of integrated circuits, and more specifically to exemplary embodiments of architecture, apparatus, methods, and computer-accessible medium for masking unknown bits.

BACKGROUND INFORMATION

A rapidly increasing complexity of VLSI designs and the associated test costs have generally rendered test data compression a de facto standard. In this test environment, captured responses can be taken through a response compactor, compressing the test responses. While test time and data volume can be thus reduced, the consequent information loss inevitably can reflect a loss in test quality. Certain errors that can be observable in the original scan responses can become unobserved in the compacted responses. Observability loss can be a consequence of multiple errors masking out the effect of each other, producing the expected values in the compressed response, or of the ambiguity induced by unknown response bits (x's) that can take on either binary value upon arbitrary initialization. Un-initialized memory elements such as, e.g., RAMs, multi-cycle paths, or bus contentions in a design can constitute potential sources for unknown values, which may propagate into a scan cell during test. Depending on the structure of the response compactor, these x's can prevent some errors that have been captured in other scan cells from being observed at the compactor outputs.

Sequential compaction circuitries, such as, e.g, multiple input single registers (MISRs), can be utilized for compressing the scan responses into a signature that can be observed at the end of the test application process. Unknown response bits can corrupt the signature, for example, if they propagate into the MISR. The fact that a single x can corrupt the MISR content can stem from its sequential nature in accumulating its signature. An x-masking circuitry, e.g., one capable of delivering per-scan and/or per-chain replacement of response x's with known constant values based on control bits delivered from Automatic Test Equipment (ATE), can be utilized in order to prevent the corruption of the signature. A costly alternative can be inserting test points to mask x's right at their sources at the expense of area cost and performance degradation. Combinational compaction solutions, e.g., XOR-based, can also be utilized for response compaction. Some of these techniques, for example, can build the response compactor based on fault sensitization information under a particular fault model assumption, while response unknown bit and unmodeled defect coverage issues can be overlooked. Similarly, utilization of a given test set to build compactors, or to reorder x-capturing scan cells can offer improved observability, while dependence on a test set can complicate the implementation of these solutions. Test set and fault model independent response compaction techniques have also been described, which can deliver some x-mitigation capabilities.

Further, selective masking/observing of chains, and further optimizations by grouping together of cells that have similar masking requirements over an interval enabled by the clustered behavior of x's can ensure the observation of the targeted faults, while potentially missing unmodeled defects. Correlation among x's can be exploited to reduce the amount of mask control data.

These compaction techniques can bear a particular resistance characteristic to unknown bits. The density and distribution of x's can determine the test quality delivered by these schemes. In the presence of an x-distribution where the corruption effect of x's is widely spread, combinational compactors typically produce mostly x's at their outputs, while sequential ones with masking-support often produce responses that are over-masked. Thus, in both types of compactors, the fault/defect information in x-free scan cells can be compromised, resulting in poor scan cell observability, and, hence, degradation in test pattern effectiveness. A test pattern inflation and hence a test cost increase may ensue upon attempts on restoring the compromised quality levels. Further, high quality screening of chips may utilize aggressive solutions such as faster-than-at-speed testing, which can generate responses with high density of unknown x's.

In an effort to cope with increasing test costs, test data compression solutions can be employed, wherein a few number of scan-in channels drive a larger number of internal scan chains through a decompression block, while the responses collected from the internal scan chains can be taken through a compactor block that drives a fewer number of scan-out channels. Driving a larger number of internal scan chains from a fewer number of scan channels can reduce the depth of the scan chains, decreasing the number of shift (e.g., scan) operations per scan pattern, and hence shortening the test application time.

Certain logic blocks, such as RAMs or tri-state buses, and setup requirement violator paths may produce values that are unknown during simulation time, and are known only after the chip has been powered up, where these values can change from one chip to another. Test patterns may propagate these unknown bits (x's) to the outputs, capture them in scan cells, and produce response patterns with x's. While the observation of individual known (non-x) bits in the response can assist with an indication as to whether the chip under test is defective, a compression of x's and non-x's altogether through a response compactor can weaken this screening process. The ambiguity induced by the response x's results in the loss of some of the known bits, which can have otherwise manifested the effect of the defects in the chip under test. Test quality, may be degraded as a result.

Accordingly, there can be a need to address and/or overcome at least some of the above described deficiencies and issues.

SUMMARY OF EXEMPLARY EMBODIMENTS

Such need can be addressed with the exemplary embodiments of the present disclosure of architecture, apparatus, methods, and computer-accessible medium for masking unknown bits.

For example, according to exemplary embodiments of the present disclosure, apparatus, methods, and computer-accessible medium for a toggle-masking procedure configured to mask some or all of the unknown x's and minimize the over-masked known bits for clustered distribution of unknown bits can be provided. In certain exemplary embodiments of the present disclosure, it is possible to utilize an exemplary toggle-masking framework as a foundation, and transform this exemplary solution into an x-filter that allows a certain number/distribution of x's to pass, in order to further improve the observability levels. According to the exemplary toggle-masking scheme of the exemplary embodiment of the present disclosure can be paired and/or utilized with another exemplary technique, such as, e.g., an x-canceling multiple-input signature register (MISR), which can be used to cancel the x's in the signature via post-processing operations. According to further exemplary embodiments of the present disclosure, it is possible to utilize the x-filter with different versions of x-canceling MISR, which may be subject to test time increase and/or observability loss with high x-density responses. Thus, in certain exemplary embodiments of the present disclosure, it is possible to provide an x-filter that can adjust the number/distribution of x in-flow into the MISR, which can provide a control over test time and observability, e.g., offering a wide spectrum of tradeoff solutions for the designers.

An exemplary toggle-based masking procedure that can be used to deliver very high observability levels in the case of clustered x distributions can be provided in certain exemplary embodiments. The exemplary procedure can, for example, assign a single-bit state to each chain, dictating whether the chain will be masked or observed. For example, a clustered distribution of x's can enable an infrequent switching of state information, minimizing the amount of mask data that cab selectively toggles the state of chains. Thus, few mask channels may typically be used to control the proposed masking hardware, which can enable the blocking of the x's while over-masking a small number of non-x bits. A capability to mask the x's can facilitate the use of a MISR in conjunction, and can thus eliminate the need for a scan-out channel, translating into enhanced parallelism in multi-site testing. Exemplary results on industrial test cases can indicate that the exemplary masking procedure can be capable of minimizing or even eliminating over-masking, which can deliver near-optimal test quality levels.

For example, according to further exemplary embodiments of the present disclosure, it is possible to use an exemplary procedure targeted for clustered distributions of x's, which can be a typical end-result of x-sources residing in close proximity. The exemplary procedure according to the present disclosure can facilitate masking a number of consecutive bits in chains by specifying, e.g., the beginning and the end locations of the x-run via the control of dedicated mask channels. The chains can be assigned a single-bit state that can dictate, for example, whether the chain is masked or observed, and the state can be toggled to switch between two states so as to mask the x's while minimizing over-masked non-x bits. It can be the case that the state of at most a single chain can be toggled in any shift cycle, which can enable a continuous-flow and simple masking circuitry controlled by log (n+1) channels for n scan chains. In exemplary experiments utilizing certain exemplary embodiments of the present disclosure on an exemplary industrial test case, the exemplary masking procedure can minimize or even eliminate over-masking, which can deliver, for example, near-perfect test quality levels.

As the exemplary procedure can be configured to mask the x's, the use of an accompanying MISR can be facilitated, preferably eliminating the use of scan-out channels. The replacement of scan-out channels with mask channels can enhance parallelism in multi-site testing. Further, the same set of mask channels can be shared among the dies being tested in parallel, but a distinct set of scan-out channels may need to be allocated for each die. Thus, eliminating scan-out channels can allow for the test of a larger number of dies in multi-site testing, e.g., delivering test time reductions.

According to exemplary embodiments of the present disclosure, apparatus, methods, and computer-accessible medium for a toggle-based masking procedure that can facilitate a delivery of very high observability levels in the case of clustered x distributions. In certain exemplary embodiments, an exemplary block can associate a single-bit state with each scan chain that dictates whether the chain is masked or observed. Clustered distribution of x's can reduce the need to update the state of scan chains. The exemplary block can enable the selection of at most one chain in every shift cycle, and can toggle its state to switch between the mask and observe states. According to certain exemplary embodiments of the present disclosure, it is possible to also provide not only an exemplary ILP formulation but also a computationally efficient exemplary greedy heuristic to minimize over-masking while blocking the x's. The exemplary procedure, by blocking the x's, can facilitate the use of a MISR in conjunction, and can thus eliminate the need for a scan-out channel, enhancing parallelism in multi-site testing.

Further, according to certain exemplary embodiments of the present disclosure, methods, computer-accessible medium, and systems can be provided for toggle-based masking of at least one scan chain. For example, it is possible to obtain previous masking information regarding at least one scan chain associated with a previous cycle; and mask the at least one chain for a present cycle based on the previous masking information. In further exemplary embodiment, it is also possible to change the masking of the at least one scan chain, e.g., while maintaining the masking of all other scan chains of the at least one scan chain.

According to further exemplary embodiments of the present disclosure, it is possible to change the masking of at most one scan chain (or a plurality of scan chains, e.g., 2, 3, etc.) in the present cycle. It is also possible to provided a decoding arrangement which can be configured to receive an address associated with each scan chain for which the masking is to be changed.

According to further exemplary embodiments of the present disclosure, it is possible to analyze a distribution of at least one unknown bit in a response pattern; and perform the masking by masking the unknown bit(s) and a subset of known bits. In addition, it is possible to minimize a number of masked known bits. In certain exemplary embodiments, the minimization procedure can be performed by the processing or computing (e.g., hardware) arrangement using linear programming.

In certain exemplary embodiments, the minimization procedure can be performed by the processing or computing arrangement using at least one integer linear programming technique (ILP). In certain exemplary embodiments, the ILP can be provided such that a number of scan chains selected includes a maximum number of scan chains. According to additional certain exemplary embodiments, the ILP can be provided to mask at least one unknown bit and/or all unknown bits. In certain exemplary embodiments, the ILP can include an optimization criterion configured to minimize the number of masked known bits.

According to particular exemplary embodiments of the present disclosure, the minimization procedure can be performed by the processing of the present disclosure arrangement using a greedy procedure. For example, the greedy procedure can include (i) masking all unknown bits and/or (ii) iteratively selecting and masking at least one known bit to satisfy a constraint of selecting at most a maximum number of scan chains in a cycle. For example, the known bits can be selected by the greedy procedure to maximally reduce decision changes from one cycle to a next cycle.

According to particular exemplary embodiments of the present disclosure, prior to using the greedy procedure, the exemplary embodiments can allow at least one lonely-x to pass, the at least one lonely-x selected from among a plurality of lonely-x's based at least in part on a quantity of toggles associated with the at least one lonely-x. In another exemplary embodiment the allowing can be performed on the at least one lonely-x until a pre-determined x-budget is reached.

These and other objects, features and advantages of the present disclosure will become apparent upon reading the following detailed description of embodiments of the present disclosure, and the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which.

Figure 1:
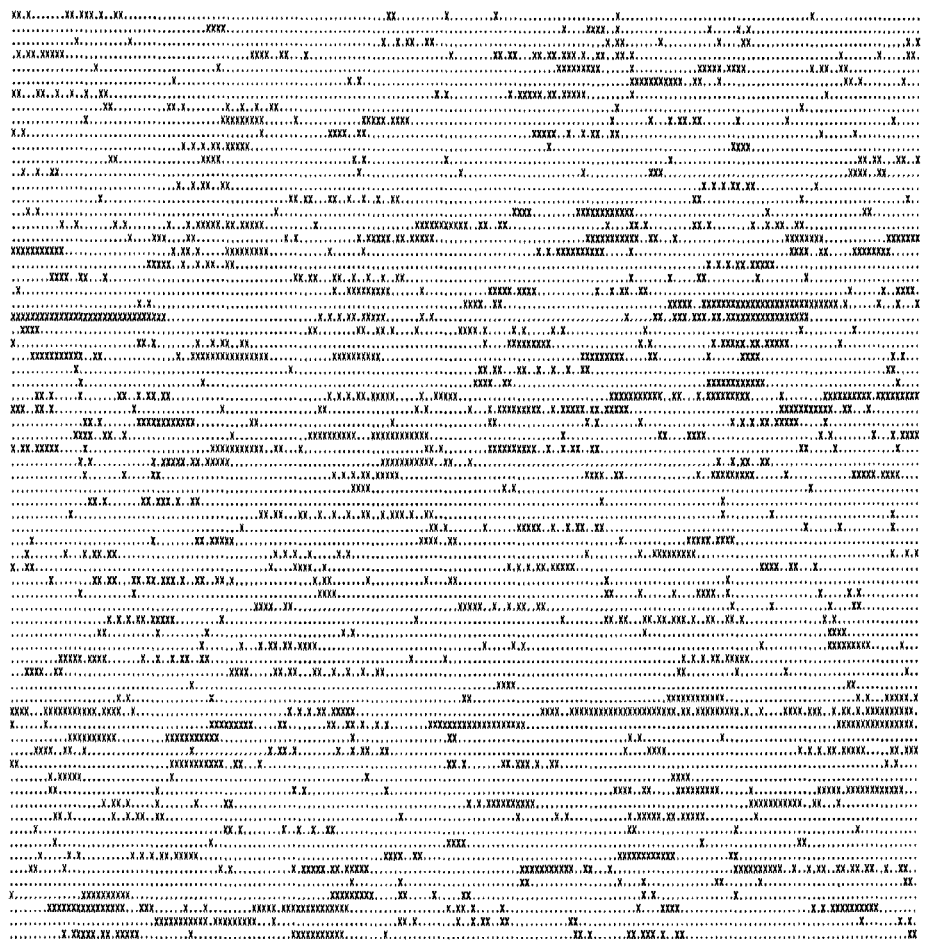
FIG. 1 is an illustration of an exemplary response pattern.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures, and provided in the appended claims.

DETAILED DESCRIPTION OF EXEMPLARY EMBODIMENTS

For example, a masking block can mask the x's and facilitate the non-x bits to be observed. The capability to mask the x's can be preferable, as it can facilitate the use of a MISR, which can eliminate or reduce the allocation of any tester bandwidth for the observation of responses. In the procedure of masking the x's, however, non-x bits can also become masked, which can be referred to as over-masking, and that can be due to the lack of a fine-grained control over specifying the exact locations of the x's. An exemplary aspect of the present disclosure can include a block that can mask the x's along with a minimum number of non-x bits.

A mask block customized with respect to a given set of responses with known distribution of x's may not be practical. Not only the exact distribution of x's can be difficult to predict a priori, the late netlist and thus test data changes can be quite common in a typical design flow. The mask block can preferably include a generic hardware arrangement capable of adapting to late design and test data changes; the mask block hardware arrangement is preferably reconfigurable via recomputed mask data.

Another possibly desirable property in a mask block can be the ability to load the mask data seamlessly during test application process. Such a continuous-flow operation can be preferable, as it can enable regular scan shift operations to continue with no interruption. A few channels can be dedicated for the loading of mask data; while the utilization of these channels for the load of test stimuli can deliver savings in test time, it can be noted that being able to mask the x's can be equally important, as the use of a no-channel-utilizing MISR is thus enabled. The dedicated mask channels can be justified, as a MISR can replace a bandwidth-consuming XOR compactor that would otherwise occupy scan-out channels to transmit compacted responses and hamper parallelism in multi-site testing.

While any arbitrary masking scheme can perform equally well for an arbitrary distribution of x bits in the response, x's typically occur in responses as clusters due to structural proximity of x sources, such as RAM blocks. Nearby scan cells, which can be stitched together in neighboring positions in a scan chain, can thus capture x's together. The end-result can be clusters of x's, namely, runs of x sequences in response vectors. Exemplar embodiments of the present disclosure can provide a masking procedure that, for example, accounts for the clustered distribution of x's.

An exemplary industrial response pattern is provided, for example, in FIG. 1. This example exhibits the location of x's and the non-x bits, and conceals information regarding the value of non-x bits; the clustered distribution of x's can be evident in this example that has, e.g., 80 scan chains, with a scan depth of 196 bits.

Figure 2:
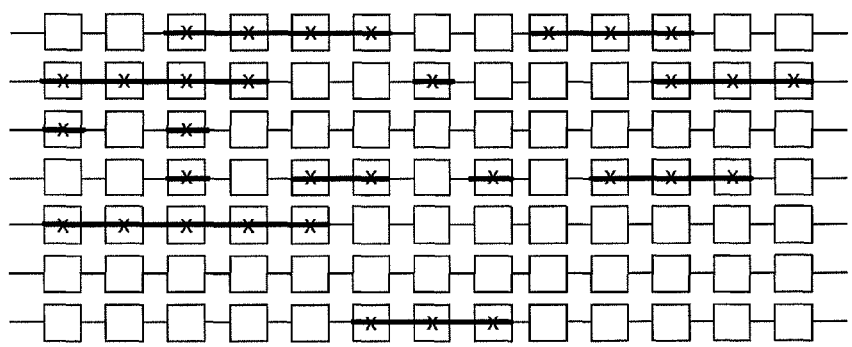
FIG. 2 is an illustration of an exemplary ideal masking.

A smaller response example is shown, for example, in FIG. 2; which illustrates an exemplary masking where the x's are blocked with no over-masking of non-x bits. This example also exhibits, for example, a clustered distribution of x's to emphasize the following observation: with clustered x's, the decision regarding masking a particular chain can remain substantially identical over a number of consecutive cycles. For example, a chain that has a run of x's can be subject to a run of cycles where it is masked. For instance, the topmost chain can include two runs of x's (e.g., chain 210 of length-3 and chain 220 of length-4), resulting in two runs of cycles where this chain can be masked. This exemplary chain can be initially observed for two cycles, which can be followed up by the first run of mask cycles of length-3. Subsequently, the exemplary chain can be observed for two cycles, and masked for four cycles. Finally, the chain can be observed for two more cycles, upon which the next capture operation can be performed.

This example can illustrate a feature of the exemplary toggle-based masking procedure. The topmost chain in the previous example can toggle between the mask and observe states; clustered distribution of x's can facilitate a reduced number of such toggles. Thus, the exemplary procedure can include masking of individual chains horizontally. A single-bit state can be associated with each chain, denoting whether the chain can be observed or masked. When the chain is preferably switched from one state to the other, its state is preferably toggled. To enable a simple and practical toggling scheme, a one-hot addressing scheme, where in substantially every shift cycle, the state of at most a single chain can be toggled. While such a single-toggle-per-cycle constraint can ensure simplicity and continuous-flow properties, an end-result can include over-masking, e.g., the inability to apply chain toggles arbitrarily can reflect into non-x bits that end up being masked along with x's, while this over-masking effect is typically minimal.

Exemplary Masking Hardware Arrangement

Figure 3:
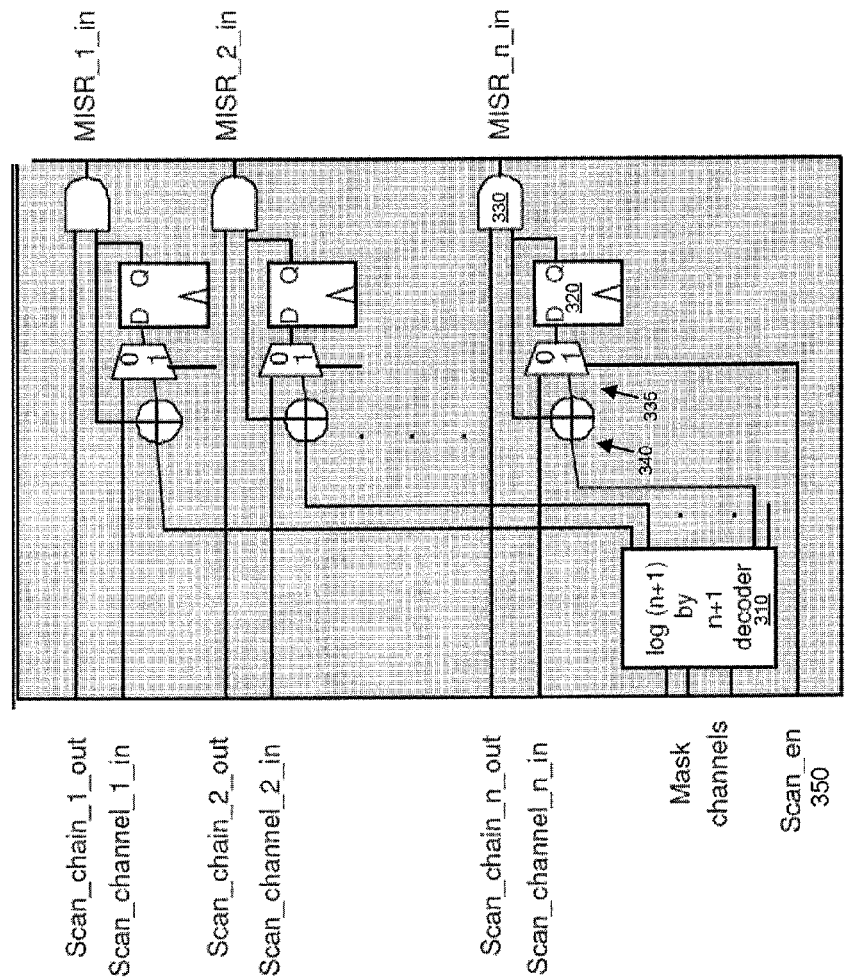
FIG. 3 is an illustration of an exemplary mask block hardware arrangement according to certain exemplary embodiments of the present disclosure.

An exemplary mask block, as shown, for example, in FIG. 3, can be inserted in between the scan chain outputs and the MISR inputs. It can include a one-hot decoder 310 that can be capable of addressing a particular chain and initiating/terminating a run of mask cycles. The exemplary block can also include a flip-flop 320 per scan chain, whose state can denote whether the run of mask cycles is ongoing for the corresponding chain; e.g., 1-state can denote no masking, while 0-state can denote that the run of mask cycles is being extended. Control signals can be provided to the decoder, which can select the particular chain that is to be toggled in a cycle. For example, AND gates 330 can be connected to the outputs of the scan chains and help achieve the actual masking. Additional MUXs 335 can be used to initialize the state of flip-flops 320, e.g., during the capture cycles by re-using the scan in channels. The flip flops 320 can be toggled at the negative edge of the clock cycle to prevent race conditions, while the shift operations can be carried out at the positive edge. The exemplary decoder can utilize $\log_2$ (n+1) dedicated channels to provide the control signals for n scan chains. The exemplary decoder can be controlled by $\log_2$ (n+1) channels directly, can select one of the flip-flops 320 inside the mask block, and can toggle its state through the XOR gate 340, effectively either initiating or terminating a run of mask cycles for the selected chain. One-hot decoder 310 can facilitate, e.g., in each shift cycle, the selection of a single chain whose state is to be toggled, while the selection of no chain can also be supported; e.g., the last output of the decoder can be left dangling for this purpose. A hierarchical implementation of the decoder can yield an area cost, e.g., of slightly more than one AND gate per scan chain for large designs.

The exemplary mask block can also include multiplexers 335 which can be controlled by the scan-enable signal 350. These multiplexers 335 can serve the purpose of initializing the flip-flops 320 during the capture window (e.g., when scan-enable=0) directly from the scan-in channels, and these channels can be idle during the capture window, and thus can be utilized for loading the proper data into the flip-flops inside the mask block. While the exemplary hardware arrangement illustrated in FIG. 3 assumes that the number of scan-in channels can equal to number of scan chains, facilitating a single cycle operation during a capture window to load the mask block flip-flops, the number of channels can also be smaller than the number of chains due to, e.g., the utilization of stimulus decompression. In that case, the flip-flops of the mask block can be configured into as many chains as the number of available scan-in channels. These exemplary flip-flops can be loaded serially, for example, via very fast shift operations (with proper routing) during capture window, however, as they dissipate negligible power, imposing only a slight capture window expansion. This way, a mask cycle run can be initiated by the beginning of the subsequent shift cycles for any chain arbitrarily. During the shift cycles (e.g., when scan-enable=1), the multiplexers can facilitate a one-hot selective toggling of flip-flop states, where the decoder addresses at most one chain to initialize/terminate a mask cycle run.

In order to prevent race condition, the exemplary flip-flops within the exemplary mask block can be toggled at the falling edge of the clock, while shift operations can be conducted for scan chains at the rising edge of the clock. This can be accomplished by generating the clock of these flip-flops with half a cycle offset with respect to the shift clock.

Exemplary Masking Procedure

An exemplary problem is described herein below: e.g., given a scan response, how can the mask data be computed or otherwise determined (e.g., using a computer arrangement) so that the x's can be masked along with a minimum number of non-x bits. The exemplary procedure can output the mask data that can properly form the runs of mask cycles, subject to the constraint that one run can be initiated/terminated in any shift cycle. This problem can be formulated as an integer linear programming (ILP) problem. Subsequently, a computationally efficient heuristic can be provided.

While the exemplary solution can be illustrated by pursuing an objective of minimizing over-masking, other objectives, such as, e.g., maximization of fault coverage can also be utilized so as to compute or otherwise determine mask data. The exemplary solution according to an exemplary embodiment of the present disclosure can thus be integrated within a fault simulation framework; in that case, non-x bits that possess fault effect information can be prioritized over other non-x bits, and can be prevented from being masked.

Exemplary ILP Formulation

A first exemplary sub-procedure in the ILP formulation can be to define the sequence of response bits for each chain as follows, e.g.:

$$\text{Sequence}[c] = (r_0^c, r_1^c, \ldots, r_{n-1}^c) \quad (1)$$

where $0 \leq c < \text{num\_chains}$, n can be the depth of the longest chain, and $r_i^j$ can be the $i^{th}$ response bit value in the $j^{th}$ chain, which can denote an x bit if $r_i^j$ 1, and a non-x bit otherwise. Sequence[i] can be, for example, a 1-dimensional binary array differentiating the x and non-x bits for chain i.

Next, the exemplary solution variables $t_{cs}$ can be defined, for which a 1 can denote that chain c can be toggled before cycle s; namely, a run of mask cycles for chain c can be either initiated or terminated at cycle s if $t_{cs}$ is, e.g., 1. The first exemplary set of constraints can be imposed by the one-hot addressing scheme; at most one chain can be toggled in any shift cycle, e.g.

$$\sum_{i=0}^{num\_chains-1} t_{ij} \leq 1, \forall\ j \geq 1 \quad (2)$$

The constraint above may not apply to j=0, as an arbitrary number of chains can be toggled during the capture window (e.g., right before the very first shift cycle).

The second set of constraints can stem from masking the x's. An exemplary run of mask cycles can be initiated and ongoing before the x bit; the corresponding chain can be toggled an odd number of times (e.g., assuming an initialization to "observe" state) since the beginning of shift cycles until the cycle where an x bit is encountered, e.g.:

$$\sum_{j=0}^{s} t_{cj} \text{ is odd}, \forall\ (c, s)\ s.t.\ \text{Sequence}[c][s] = 1 \quad (3)$$

The constraint above can be formulated, e.g., as a linear constraint as follows, e.g.:

$$\sum_{j=0}^{s} t_{cj} = 2m + 1, \forall\ (c, s)\ s.t.\ \text{Sequence}[c][s] = 1 \quad (4)$$

Additionally, the exemplary optimization criterion can be formulated as the maximization of the number of bits that can be observed. This can be the same or similar as stating that runs of mask cycles has been terminated (e.g., toggled an even number of times) prior to a maximum number of shift cycles:

$$\text{maximize} \sum_{i=0}^{num\_chains-1} \sum_{j=0}^{n-1} obs(i,j),$$

where a binary variable $obs(i,j)$ can denote whether the $j^{th}$ cell of chain i can be observed, e.g.:

$$obs(i,j) = \sum_{k=0}^{j} t_{ik} - 2l + 1, \forall (i,j) \text{ s.t. Sequence}[i][j] = 0 \quad (5)$$

If chain i is toggled an even number of times prior to cycle j ($\Sigma_{k=0}^{j} t_{ik}$=even), then $obs(i,j)$ can be 1.

Figure 4:
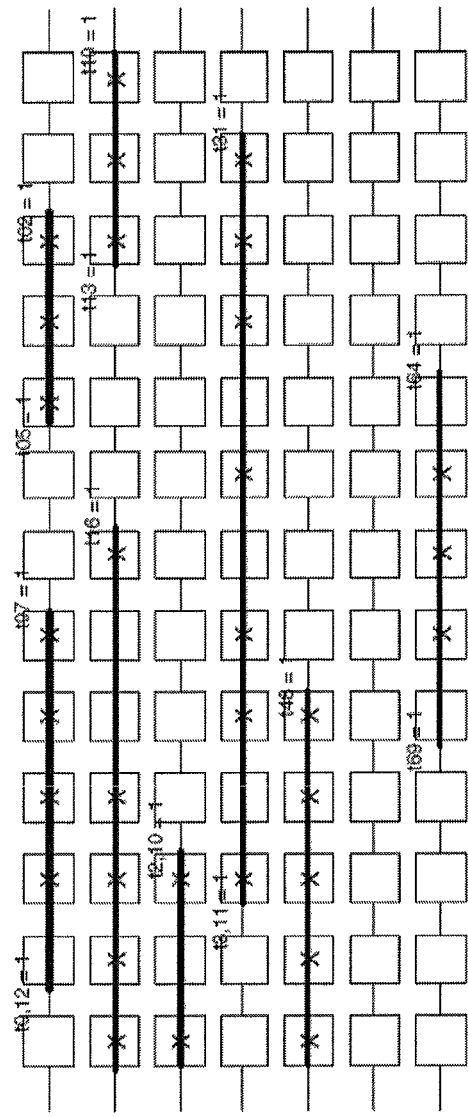
FIG. 4 is an illustration of an exemplary masking according to a first exemplary embodiment of the present disclosure.

The ILP formulation described herein above can be illustrated on the scan response example shown in FIG. 4 that has, e,g., seven chains, each with 13 bits. In this exemplary case (e.g., as illustrated in FIG. 4) an exemplary set of sequence chains can be provided as:

Sequence[0]=(0, 0, 1, 1, 1, 0, 0, 1, 1, 1, 1, 0, 0)
Sequence[1]=(1, 1, 1, 0, 0, 0, 1, 0, 0, 1, 1, 1, 1)
Sequence[2]=(0, 0, 0, 0, 0, 0, 0, 0, 0, 0, 1, 0, 1)
Sequence[3]=(0, 1, 1, 1, 0, 1, 0, 1, 1, 0, 1, 0, 0)
Sequence[4]=(0, 0, 0, 0, 0, 0, 0, 1, 1, 1, 1, 1, 1)
Sequence[5]=(0, 0, 0, 0, 0, 0, 0, 0, 0, 0, 0, 0, 0)
Sequence[6]=(0, 0, 0, 0, 0, 1, 1, 1, 0, 0, 0, 0, 0)

An example constraint of the former type can be, e.g.:

$$t_{01}+t_{11}+t_{21}+t_{31}+t_{41}+t_{51}+t_{61} \leq 1$$

There can be more constraints of this type (e.g., 11 constraints), each likely ensuring, for example, that at most a single chain can be toggled in any shift cycle.

An example constraint of the latter type, which can ensure that each x bit is masked, can be, e.g.:

$$t_{00}+t_{01}+t_{02}=2m0+1$$

for the x bit in the third rightmost position of the topmost chain. There can be, e.g., 31 more constraints of this type, one for each of the remaining x bits.

For the non-x bit in the last position of the first chain, $obs(0,12)$ can be defined as, e.g.:

$$obs(0,12)=t_{00}+t_{01}+\ldots+t_{0,12}-2l0+1$$

Similarly, 58 more binary obs variables can be defined, with one corresponding to each non-x bit. An ILP solver's objective can be to maximize the sum of these 59 obs variables.

The exemplary ILP solver can produce the following solution variables to be 1's for the first chain, e.g.: $t_{02}$, $t_{05}$, $t_{07}$, $t_{0,12}$. The 1-value solution variables can indicate the start and end-points (e.g., namely, toggle points) of the mask cycle runs; for the first chain, the first two bits can be observed, the subsequent three can be masked, the subsequent two bits can be observed, the subsequent five bits can be masked, and the last bit can be observed. For this exemplary chain, in addition to the x bits, one non-x bit (e.g., $12^{th}$ bit in the chain) can be additionally masked. The exemplary solution with the toggle points is provided, for example, in FIG. 4; along with the x bits, 9 non-x bits can be masked as well, resulting in, for example, 50 bits to be observed. It can be noted that in each shift cycle, mask state of at most one chain can be toggled, complying with the one-hot addressing constraint.

Exemplary Greedy Heuristic

While the exemplary ILP formulation can facilitate the utilization of efficient ILP-solvers in obtaining a near-optimal solution, the computational run-time may be prohibitive for large size instances. Accordingly, in certain exemplary embodiments of the present disclosure, it is possible to implement and include a computationally efficient greedy heuristic procedure that can be used to provide and/or create the mask cycle runs, as described herein.

The exemplary greedy heuristic can initially begin from the exemplary (e.g., ideal) masking, and can transform this exemplary ideal solution into one that can comply with the one-hot toggling constraint. In the exemplary sub-procedure, the exemplary greedy heuristic can turn a non-x bit into an x-bit, prolonging the runs of mask cycles, and thus reducing the toggle points. The exemplary heuristic can be terminated with prolonged runs such that the final runs can satisfy the one-hot toggling constraint. As the exemplary heuristic loses one non-x bit in each procedure, the number of execution procedures can determine the deviation of the final solution from the ideal one. In order to lose the fewest non-x bits possible, the exemplary greedy heuristic can preferably target the cycle with the maximum number of toggle points first; for example, it can select the non-x bit adjacent to the column corresponding to the cycle such that turning this non-x bit to an x bit can reduce the number of toggle points in the cycle. The exemplary greedy heuristic can preferably terminate when the number of toggle points in every cycle is at most one.

Figure 5:
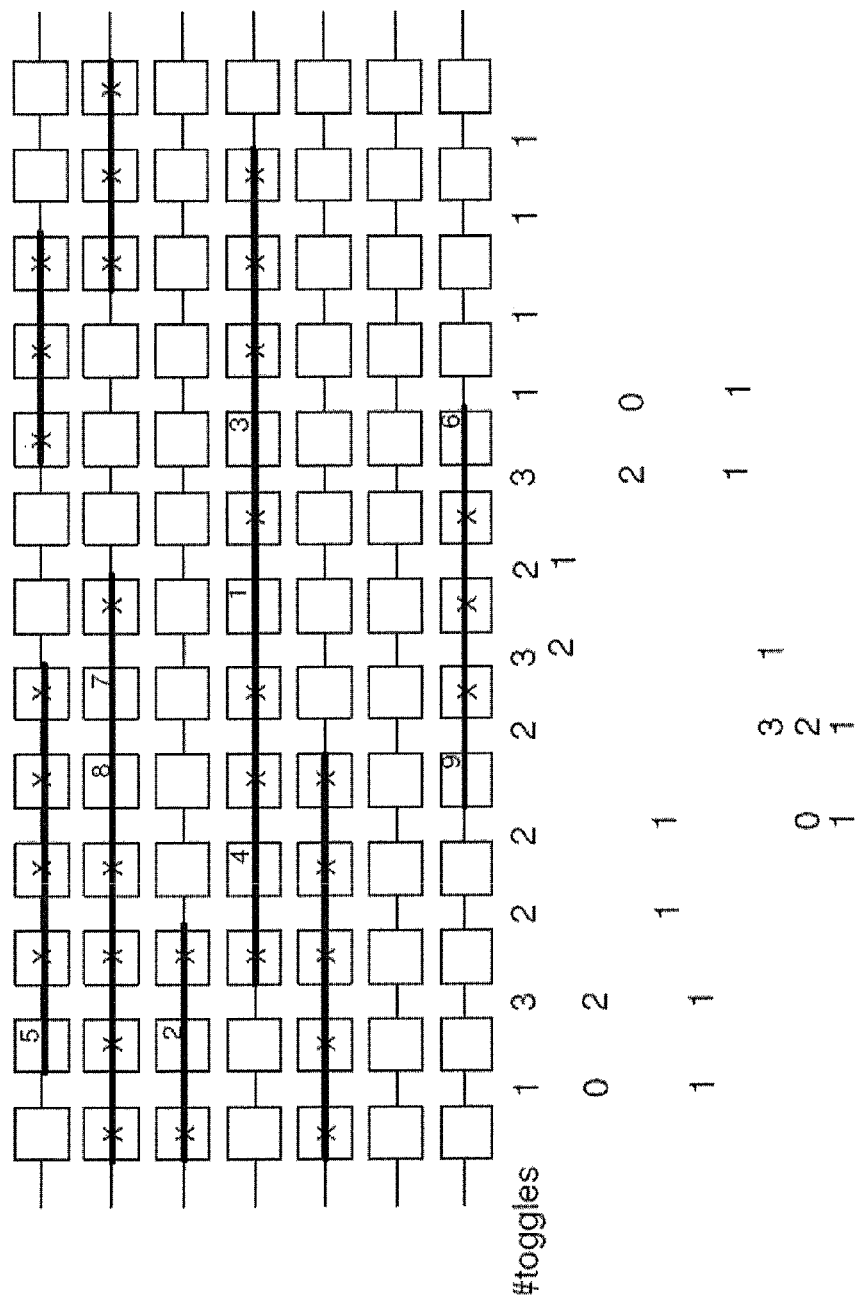
FIG. 5 is an illustration of an exemplary masking according to a second exemplary embodiment of the present disclosure.

The exemplary greedy heuristic is illustrated, for example, in FIG. 5, via a step-by-step execution of the exemplary heuristic. In the bottom of FIG. 5, the exemplary number of toggle points in the cycles are listed for the steps of the exemplary heuristic, starting from the toggle points corresponding to the ideal masking shown in FIG. 2. Furthermore, the non-x bits that are turned into x bits can be numbered indicating the order in which they are selected by the heuristic. For example, in the exemplary ideal masking procedure that the heuristic starts from initially the maximum number of toggle points can be, e.g., 3; therefore, the first non-x bit selected by the heuristic can be the seventh bit of the fourth chain, creating a longer run of mask cycles, and thus reducing by one the toggle points for the maximal cycle. For example, for nine steps, the exemplary heuristic can turn nine non-x bits into x bits to be masked in the exemplary procedure. For this example, the solution that the exemplary greedy heuristic can produce can be of the same quality as that the exemplary ILP solver produced as described herein above; e.g., 50 bits can be observed in both cases, although the solutions can be distinct.

The exemplary mask data to be fed from the dedicated channels can be computed or otherwise determine by analyzing the response patterns. The exemplary greedy heuristic can also be used to start from an ideal masking of x's (e.g., masking all x's and allowing all non-x's to pass), and transform this exemplary solution into one that can satisfy the "toggling a single-chain-per-cycle" constraint while (over-) masking a minimum number of non-x bits, e.g., along with all the x's. The exemplary step-by-step execution of this exemplary heuristic shown in FIG. 5 illustrates where nine known bits are over-masked.

In x-canceling MISR, each exemplary response bit in the scan cells can be represented by a symbol. These symbolic values can be accumulated in the MISR (e.g., including the x bits). Each bit of the final MISR signature can be represented as a linear equation of the scan cell symbols. As a result, the signature bits can be represented by a linear equation of X symbols, resulting in a matrix that represents the dependence of each MISR bit on the X symbols. By applying Gaussian elimination techniques, the linearly dependent rows of the matrix can be translated into x-canceled combinations of MISR bits. If q x-canceled combinations are obtained, the error coverage can be approximately $1-2^{-q}$. In FIG. 5, it is also shown that q x-cancelled combinations can be generated by passing m-q x's into the MISR, where m is the number of MISR bits.

During an exemplary test, shift operations can be carried out until the MISR is filled with an exemplary maximum allowed number, e.g., (m-q) of x's. Subsequently, the signature can be processed by selectively XOR-ing the signature bits that are linearly dependent to generate the x-cancelled combinations that can feed yet another MISR on-chip, which can be a traditional MISR on-chip or one according to another exemplary embodiment. The error coverage, determined by the number of x-canceled bits, can be independent of the distribution of x's ire the response.

For example, X-cancellation through XOR operations can be performed in at least two different schemes. In the first exemplary scheme (e.g., time multiplexing), these operations can be carried out by stalling the shift operations every time the MISR is filled up with m-q x's. A test time penalty can be the end-result, and the magnitude of this penalty can depend on the x density in the response pattern; the duration of each stall can be q cycles. A separate exemplary control signal can be utilized via a dedicated channel, as the stall operations take place aperiodically.

In the second exemplary scheme (e.g., shadow register), a shadow register can be used to copy the MISR content so as to perform the signature post-processing operations without stalling the shift operations, and thus, eliminating the test time penalty. The error coverage can depend on the time available for the signature processing phase. If the number of cycles in between the signature post-processing operations is not sufficient to carry out the x-cancellation operations, error coverage loss can be the end-result. Additionally, the area overhead of the shadow registers can be another cost factor.

Exemplary Toggle-Masking as an X-Filter

An exemplary distribution of the x's in response patterns can be clustered (e.g., not random) due to the close proximity of x-sources, for example. An exemplary x-masking block that can be used to mask some or all the x's in a response pattern can be effective in mitigating clustered x's. An exemplary x-canceling MISR solution can be used to extract a partial although clean x-free response, e.g. while the feed-in of a few x's into a MISR can still be tolerated by post-processing the signature. The error coverage can be enhanced by such exemplary approach, while an x-masking solution may be needed for x-heavy patterns in reducing the number of x's that feeds into the x-canceling MISR. According to exemplary embodiments of the present disclosure, it is possible to utilize a toggle-masking framework as a foundation, and further implement exemplary x-masking procedures that can facilitate the observation of a larger number of known bits by masking most of the x's.

The exemplary toggle-masking approach according to certain exemplary embodiments of the present disclosure can be based on masking a number of consecutive bits in chains, e.g., by only specifying the beginning and the end locations of the x run via the control of dedicated mask channels. For example, every chain can be assigned a single-bit state that dictates whether the chain is masked or observed; the state can be toggled to switch between the two states so as to mask all x's while minimizing overmasked non-x bits. The state of, e.g., at most a single chain can be toggled in any shift cycle, facilitating a continuous-flow and simple masking circuitry controlled by $\log_2 (n+1)$ channels for n scan chains.

Exemplary X-cancelling MISR schemes can perform poorly with large x-densities, since signature post-processing can be required to be done frequently. In the exemplary time multiplexing scheme, this can reflect as a test time penalty, as shift operations can be stalled. In the exemplary shadow register scheme, frequent signature post-processing may reflect as error coverage loss, e.g., due to the reduced time to perform signature post-processing. An exemplary x-filtering solution that can control the in-flow of x's into the MISR can benefit both schemes. Exemplary toggle-masking procedure, in conjunction with the exemplary x-canceling MISR, can exemplary controllable trade-off points, offering a wide variety of solutions to choose from.

In certain exemplary embodiments of the present disclosure, it is possible to utilize the basic toggle-masking scheme, which was originally proposed for masking all x's, as a foundation to develop and/or provided an exemplary x-filtering block. In these exemplary embodiments, a particular exemplary subset of x's can be chosen and passed into the MISR so as to lower over-masking in the toggle-mask scheme, while reducing the test time penalty of the time multiplexed x-canceling scheme or increasing the error coverage in the shadow register based x-canceling scheme. These exemplary schemes can utilize exemplary customized procedures, and in the exemplary embodiment of the present disclosure, it is possible to therefore implement different embodiments of the exemplary x-filtering block. In one exemplary embodiment of the present disclosure, a pre-defined budget can dictate the number of x's per-pattern that can be allowed to feed into the MISR, while in another exemplary embodiment, a certain number of x's per-cycle constrain t can be implemented.

Budget-Driven Toggle-Masking

The toggle-masking scheme can be driven by a one-toggle-per-cycle constraint. The basic masking algorithm can work on reducing the number of toggles in each cycle by over-masking known bits iteratively, until the single-toggle-per-cycle constraint is met. By passing x's whose masking would contribute to toggles in a cycle otherwise, the number of toggles in that cycle (and adjacent cycle) can be reduced. With fewer toggles, a smaller number of known bits have to be over-masked, observability, and thus, test quality can be improved.

Figure 6:
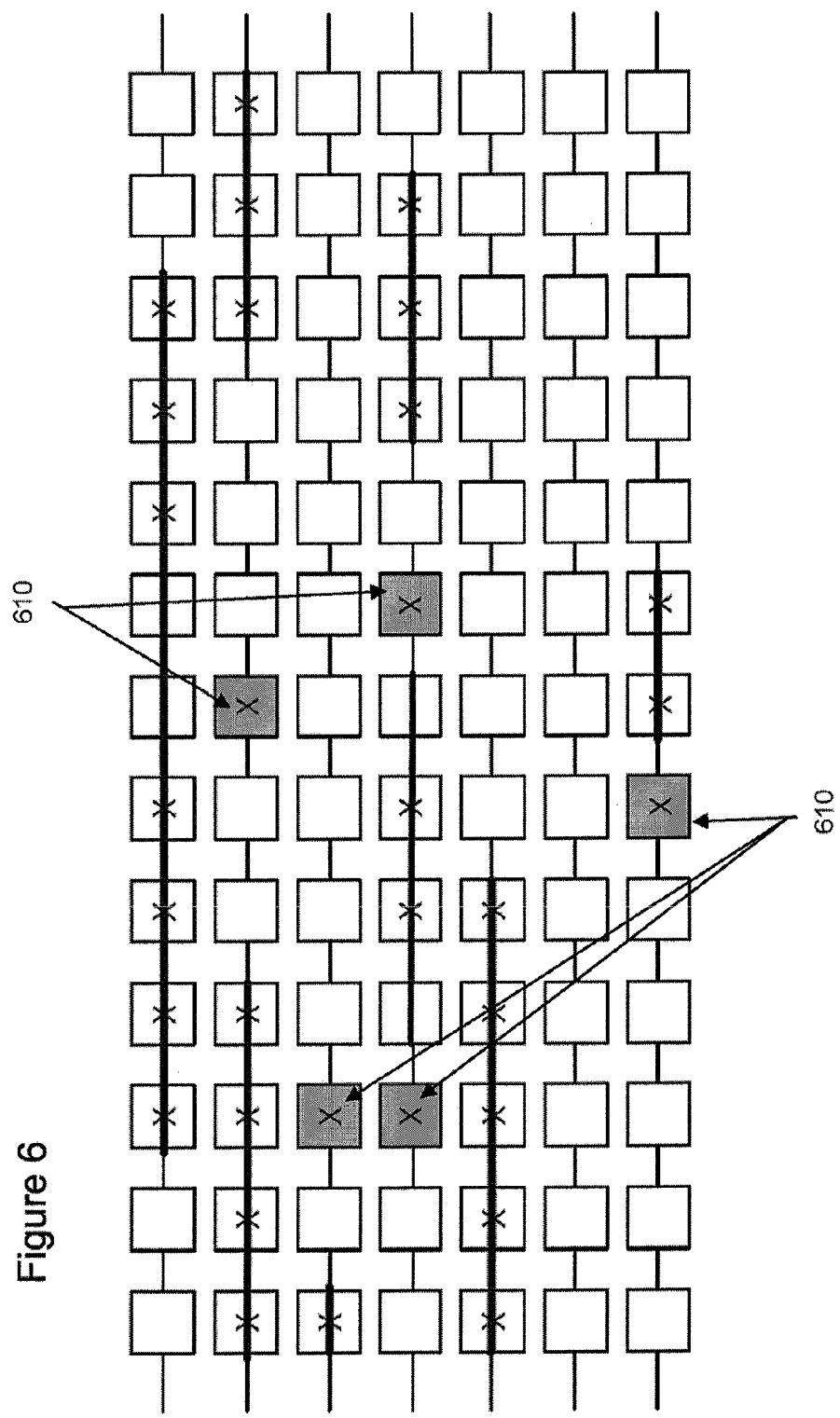
FIG. 6 is an illustration of the exemplary masking according to a third exemplary embodiment of the present disclosure.

A pre-defined value, e.g., the budget, can dictate the number of x's that can be allowed to feed into the MISR. At most, e.g., this many x's can be selected to reduce the number of toggles maximally, minimizing over-masking. In the example illustrated in FIG. 6 (which shows a similar response pattern as that indicated in FIG. 2), an exemplary budget of five x's drives the exemplary masking of x's. One-toggle-per-cycle constraint is still met and this time, over-masking can be reduced, e.g., from nine down to four known bits by allowing five x's 610 to feed through the toggle-mask block into the MISR. These x's 610 can be judiciously and/or carefully selected to reduce the number of toggle.

It is possible to utilize various exemplary approaches to implement the exemplary budget-driven toggle-masking procedure, such as, e.g., targeting the lonely x's, which can denote a single x with two non-x bits in either side and introduce two toggles had the two known bits been observed. By allowing such x to go through, two toggles can be saved (e.g., avoided). The following exemplary procedures can search for the occurrences of such x's and allow them to pass through the masking block. This exemplary operation can then be repeated until the budget of x's runs out. These exemplary procedures can vary in the order in which they target such x's.

Figure 7:
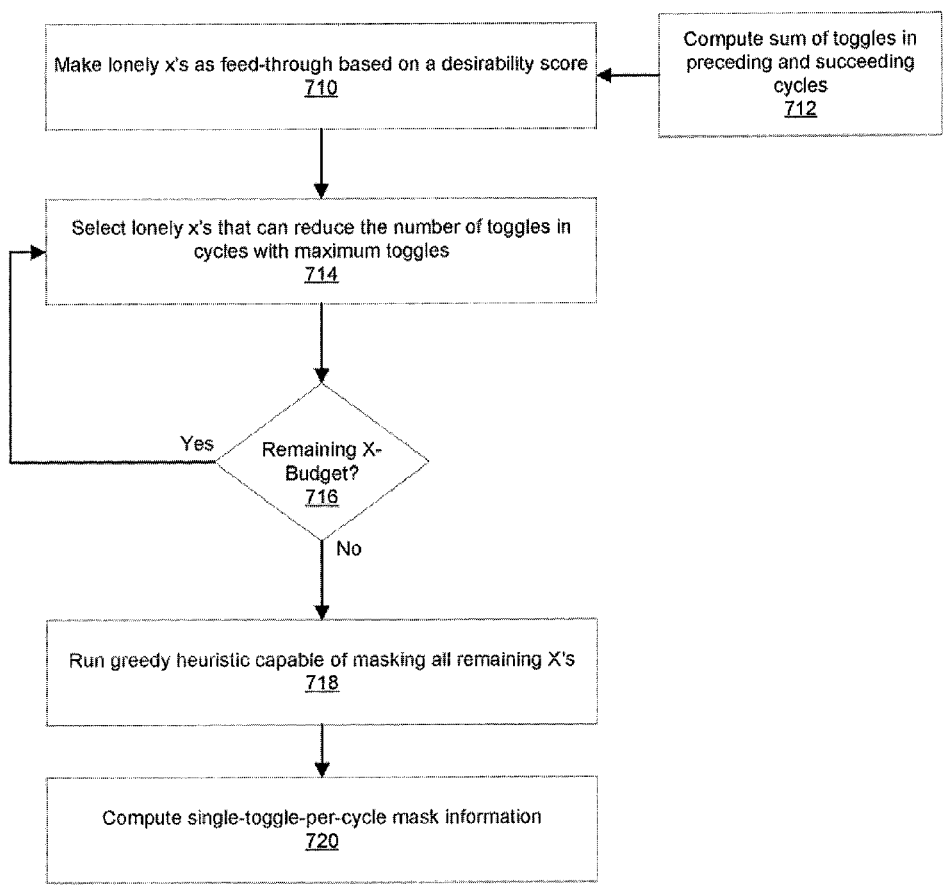
FIG. 7 is flow diagram of an exemplary procedure according to an exemplary embodiment of the present disclosure.

In one a first exemplary preprocessing procedure shown in a flow diagram of FIG. 7, response patterns can be preprocessed by marking the lonely x's as feed-through based on a desirability score at block 710 that can be computed by, e.g., the sum of the number of toggles in the preceding and the succeeding cycles, e.g., at block 712. This can be done as part of the exemplary procedure or loaded/received from a pre-existing source. The lonely x's, which can reduce the number of toggles in the problematic cycles (e.g., with maximum toggles) can be selected earlier, e.g., at block 714. Once the x-budget runs out, e.g., at block 716, the exemplary greedy heuristic that can be used to mask some or all of the remaining x's (e.g., as described in exemplary embodiments herein) can subsequently run/execute (e.g., at block 718) to compute the single-toggle-per-cycle mask information, e.g., block 720. This exemplary scheme can provide a fast yet static procedure.

Another prioritized preprocessing exemplary procedure according to a second exemplary embodiment of the the present disclosure can include a variant of the first exemplary preprocessing procedure described herein above with reference to FIG. 7 with the following exemplary difference: the effect of allowing an x to pass through can be taken into account, and can be reflected into the desirability scores. In certain exemplary embodiments of this exemplary procedure, every time a lonely-x is selected, the number of toggles in each cycle can be recomputed, as well as the desirability scores. Similar to the first exemplary preprocessing procedure, the exemplary greedy heuristic in this exemplary embodiment can be subsequently executed to mask all the remaining x's once the budget runs out. This exemplary procedure can be more computationally demanding, yet provided a more dynamic procedure, e.g., as compared to the first exemplary preprocessing procedure.

In a third exemplary procedure according to an exemplary embodiment of the present disclosure, a runtime processing exemplary procedure in which a selection of the lonely x's is performed can be integrated within the exemplary greedy heuristic that over-masks one known bit at a time and the two exemplary operations can be intertwined. This exemplary procedure can provide a more dynamic approach (e.g., as compared to the first and second exemplary procedures), as the desirability scores, which can be recomputed in each step, can be representative and accurate.

In each of these exemplary procedures, the number of x's entering the MISR can be equal to the smaller one of the budget and the number of lonely x's. The third exemplary procedure can provide certain advantages as a higher error coverage can be the end-result of fewer x's feeding into the MISR.

Exemplary Per-Cycle Constrained Toggle-Masking

For example, per-cycle constrained toggle-masking filters x's such that only a certain number of x's can feed the MISR in the same cycle, which can make the in-flow of x's into the MISR uniform. This exemplary scheme can be useful for the shadow registered x-canceling MISR, as its implementation can be simplified by a reduced and uniform distribution of x in-flow. Further, exemplary signature post-processing operations can then be interleaved by a fixed number of cycles, which can be controlled to maximize error coverage. Another consequent benefit can include the elimination of the channel dedicated for the MISR control signal, which can now be a periodic waveform and can be easily generated on-chip.

According to ceratin exemplary embodiments of the present disclosure, an exemplary procedure can be provided that can constrain the number of x's to one-per-cycle, and yet another exemplary procedure can extend this to multiple-x's-per-cycle. In doing so, exemplary procedures can make a few scan chains exempt from masking, observing these chains intact (x's and non-x's) on a per-pattern basis. The set of chains exempt from masking can differ from one pattern to another. In certain exemplary procedures, only these chains can be allowed to produce x's, and the x's in all the other chains can all be masked via toggle-masking, e.g., by subsequently executing the greedy heuristic on the non-exempt chains. By having a group of chains exempt from masking, all the known bits in these chains can be observed, enhancing the observability and thus test quality.

In the exemplary one-x-per-cycle constrained toggle-masking procedure according to an exemplary embodiment of the present disclosure, two or more chains can be exempt from masking for a pattern as long as they never produce an x in the same cycle for that pattern, as two x's in the same cycle is not allowed in this exemplary embodiment. This can lead to a compatibility notion: for a given response pattern, two or more chains can be compatible if (and only if), e.g., they never produce x's in the same cycle. For any given pattern, a group of chains may be exempt from masking, as long as no two chains in the group produce an x in the same cycle. Further, a group of chains can be compatible if they are all compatible pairwise.

In certain exemplary embodiments, the group of chains exempt from masking can be as large as possible, as more known bits can then be observed. According to further exemplary embodiments of the present disclosure, it is possible to also account for the fact that all-x masking can be pursued for the remaining scan chains, and thus can favor the exemption of chains with a larger number of toggles. In this way, these toggles can be saved, observing a larger number of known bits in also the other (non-exempt) chains.

Identifying the group of chains exempt from masking can be mapped to a maximum weighted clique problem. An exemplary graph can be formed where the nodes denote the chains, and compatibility edges connecting the nodes can denote that the corresponding two chains never produce x's in the same cycle for the pattern under analysis. The nodes can be assigned weights that can denote the number of toggles within the associated chain. For example, a maximally weighted all-compatible group of nodes (maximally weighted clique) in this graph can correspond to the group of chains that is exempt from masking for the pattern, saving the maximum number of toggles for the non-exempt chains.

Figure 8:
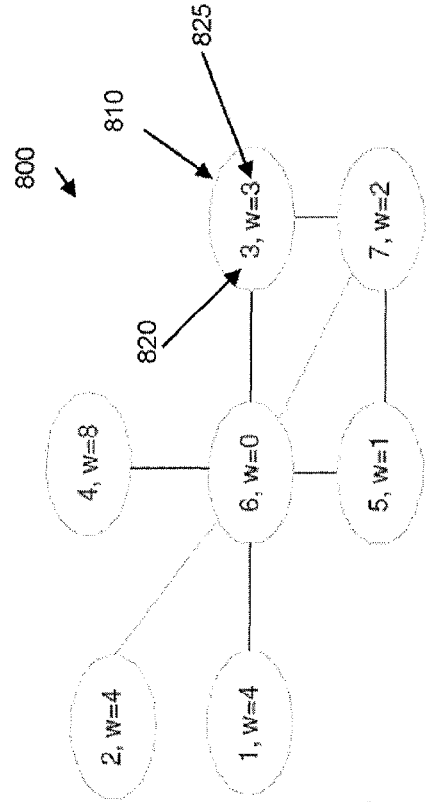
FIG. 8 is an illustration of another exemplary masking and an associated exemplary node graph according to a fourth exemplary embodiment of the present disclosure.
Figure 8:
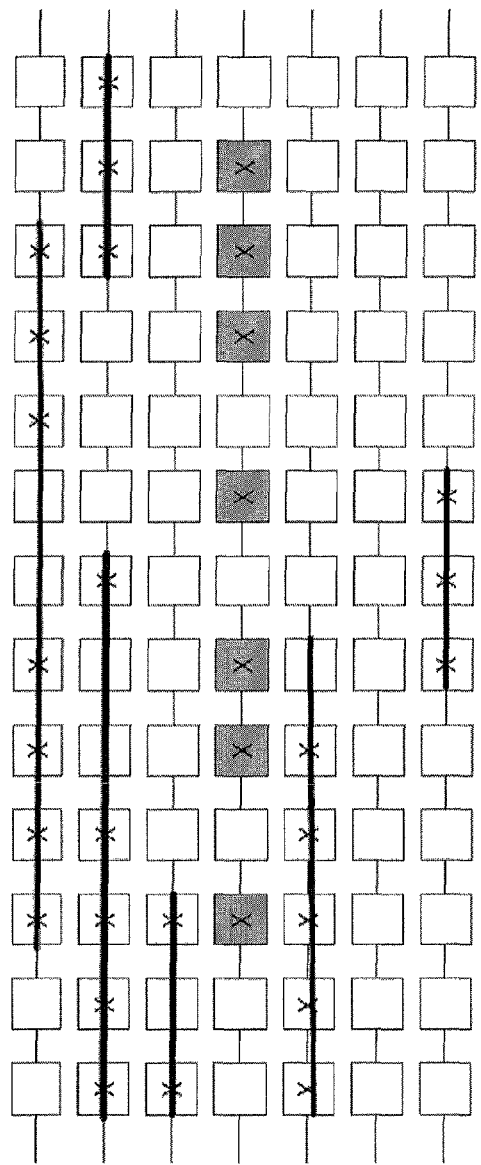

For the same exemplary response pattern (e.g., as described herein with respect to the illustration shown in FIG. 2), an exemplary compatibility graph 800 is shown in FIG. 8, and the maximum weighted clique procedure can be executed so as to identify the group of chains to be exempt from masking. The exemplary compatibility graph can consist of seven nodes 810, each corresponding to a scan chain. Inside the nodes 800, an index of a chain 820, followed up by its weight 825 (e.g., number of toggles within the chain) can be provided. The bottommost three chains with indices 5, 6, and 8, are shown in FIG. 8, illustrating a formation of a clique with a total weight of three. The exemplary chains 3, 6 and 8 are also shown in FIG. 8 so as to form an exemplary clique with a total weight of five. The maximally weighted clique is shown in FIG. 8 as the two nodes 4 and 6 in this case, with a total weight of eight. These two exemplary chains can thus be exempt from masking for this particular pattern, saving eight toggles. All the x's in the other chains can be masked via the greedy heuristic as illustrated in FIG. 8. For example, the number of over-masked known bits can be six instead of nine.

The exemplary procedure described herein can be extended to allow multiple-x's-per-cycle to pass through the mask block. For example, if k x's are allowed in every cycle, the maximally weighted clique algorithm can be executed k times on the compatibility graph, which can identify k groups of chains to be exempt from masking. As every group can produce at most a single-x-per-cycle in certain exemplary embodiments, k groups can produce at most k-x's-per-cycle in these exemplary embodiments. Thus, the in FIG. 8 signature in the shadow registered x-canceling MISR can be post-processed safely in every m-q cycles, which can provide perfect or near-perfect control over this duration and can enhance the error coverage by adjusting k.

Exemplary Experimental Results

Certain exemplary embodiments of the exemplary procedures were utilized/implemented in an exemplary experiment executed on industrial (e.g., stuck-at) response patterns that were obtained from Cadence. In particular, certain exemplary experiments implemented the three exemplary budget-driven toggle-masking approaches (preprocessing, prioritized preprocessing, and runtime processing), the exemplary greedy heuristic approach, and the k-per-cycle constrained toggle-masking approaches for various values of k. The exemplary results report, e.g., the number of observable known bits for all these exemplary approaches. The results with a budget value of 0 represents the exemplary Toggle-Based Masking Scheme, while an unlimited (∞) budget represents the exemplary X-Canceling MISR applied alone. These can represent the two extremal solutions. The exemplary x-filer can include $\log_2 N$ bits of control information per cycle.

The exemplary masking procedure can block the x's in addition to a minimum number of non-x bits. The use of an accompanying MISR block can thus be enabled and/or facilitated. Further, observability comparisons against two compaction schemes, both based on XOR-based compaction, are also described herein. (The number of non-x bits that can be observed is reported. While these exemplary results may overlook the impact of aliasing, which can be negligible in any case, a more accurate reporting of results can also be provided via an integration into a fault simulation framework). The first one, e.g., X-compact, is based, for example, on the use of overlapping XOR trees as the response compactor, while the latter one, for example, is simple XOR trees constructed in a non-overlapping manner. To ensure a fair comparison, the comparison was made against XOR compactors that also utilize log(n+1) dedicated scan-out channels (e.g., XOR trees), as the exemplary masking block can utilize log(n+1) dedicated mask channels, where n can denote the number of scan chains. Runtimes are not reported, as all schemes can execute within a second.

An exemplary design can have, for example, 22213 scan cells distributed over 100 scan chains, with a depth of 223. Table 1 provides exemplary observability results (e.g., the number of bits observed) for the three schemes, in addition to the number of x's in the responses provided in the second column.

TABLE 1

Response patterns of an industrial design with 22213 bits distributed over 100 scan chains

| Resp. | Num. x's | X-compact [19] | Non-over XORs | Proposed |
|---|---|---|---|---|
| 1 | 554 | 9390 | 11150 | 21649 |
| 2 | 571 | 9640 | 11910 | 21346 |

TABLE 1-continued

Response patterns of an industrial design with 22213 bits distributed over 100 scan chains

| Resp. | Num. x's | X-compact [19] | Non-over XORs | Proposed |
|---|---|---|---|---|
| 3 | 1841 | 1063 | 6719 | 14567 |
| 4 | 919 | 6506 | 10958 | 14755 |
| 5 | 2263 | 457 | 4858 | 7427 |
| 6 | 3578 | 0 | 1654 | 12155 |
| 7 | 570 | 10511 | 12071 | 15898 |
| 8 | 2839 | 80 | 3046 | 7314 |
| 9 | 607 | 10054 | 11852 | 19002 |
| 10 | 2227 | 655 | 4896 | 12986 |

The exemplary results for the 10 response patterns of this design can show that overlapping XOR trees (e.g., X-compact) can suffer from the corruption impact of x's, e.g., especially in the case of high density x's, most of the non-x bits can be corrupted. While non-overlapping XOR trees can cope with the corruption impact of x's somewhat better compared to overlapping XOR trees, the exemplary masking procedure can handle clustered x's in a much better manner; the exemplary procedure can consistently deliver a high level of observability. Furthermore, for the first two response patterns, the exemplary procedure can deliver minimal over-masking and thus can enable the observation of almost all the non-x bits, while only half of the non-x bits are typically observed with XOR-tree compactors.

Similar exemplary results are provided in Table 2 for another industrial design, e.g., with 61298 scan cells distributed over 177 scan chains. For all of the 10 exemplary patterns, overlapping and non-overlapping XOR trees can deliver comparable and poor observability levels, while the exemplary masking procedure can reap the benefit of negligible over-masking.

TABLE 2

Response patterns of an industrial design with 61298 bits distributed over 177 scan chains

| Resp. | Num. x's | X-compact [19] | Non-over XORs | Proposed |
|---|---|---|---|---|
| 1 | 300 | 1435 | 1229 | 60978 |
| 2 | 213 | 1522 | 1356 | 61075 |
| 3 | 204 | 1531 | 1366 | 61082 |
| 4 | 186 | 1549 | 1393 | 61106 |
| 5 | 183 | 1552 | 1399 | 61106 |
| 6 | 174 | 1561 | 1410 | 61123 |
| 7 | 528 | 1207 | 903 | 60770 |
| 8 | 156 | 1579 | 1438 | 61138 |
| 9 | 192 | 1543 | 1383 | 61098 |
| 10 | 528 | 1207 | 903 | 60770 |

The exemplary procedure can enable the observation of almost all non-x bits in substantially all cases, which can deliver significantly superior results over XOR-based compactors. For the exemplary patterns 7 and 10, the exemplary procedure can eliminate over-masking completely.

The observability enhancements of the exemplary procedure can be reaped at a very minor area cost. For instance, the 7×101 and 8×178 decoders which can be used in the two designs can be hierarchically implemented by using 134 AND gates and 222 AND gates, respectively, along with a few (e.g., 7 or 8) inverters; the total area cost of the proposed block per scan chain can therefore be roughly 2.3 AND gates, 1 XOR gate, 1 MUX and 1 flip-flop, which can be negligible for large industrial designs.

Table 3 indicates the exemplary results on two industrial designs (e.g., A: 80 chains with a depth of 196, and B: 100 chains with a depth of 223), the respective observability results, in terms of the number of observable known bits, averaged over 10 response patterns for each design are provided for different budget values and per-cycle constraints. In addition, for all these exemplary approaches, the average normalized test time is reported as well.

TABLE 1

Number of observable bits averaged over 10 response patters for two industrial designs.

| Budget/Constraint | Pre Proc. | Prioritized | Runtime P. | Norm. Test Time |
|---|---|---|---|---|
| Design A: 15669 bits over 80 chains | | | | |
| 0 | 3049.8 | 3049.8 | 3049.8 | 1.0 |
| 1 | 3048.2 | 3048.2 | 3048.4 | 1.0 |
| 2 | 3050.1 | 3053.1 | 3042.3 | 1.0 |
| 4 | 3048.4 | 3061.4 | 3041.4 | 1.0 |
| 8 | 3051.7 | 3050.6 | 3045.2 | 1.0 |
| 16 | 3075.0 | 3053.7 | 3055.2 | 1.0 |
| 32 | 3061.0 | 3058.6 | 3069.8 | 1.0 |
| 64 | 3094.2 | 3154.6 | 3177.5 | 1.0 |
| 128 | 3364.3 | 3369.9 | 3383.5 | 1.0 |
| 256 | 4068.6 | 4123.5 | 4145.2 | 1.2 |
| 512 | 6024.4 | 5981.2 | 5927.4 | 1.5 |
| ∞ | | 13815.0 | | 3.4 |
| 1x-per-cycle | | 3714.4 | | 1.0 |
| 2x-per-cycle | | 4324.3 | | 1.0 |
| 4x-per-cycle | | 5462.9 | | 1.0 |
| Design B: 22213 bits over 100 chains | | | | |
| 0 | 11067.6 | 11067.6 | 11067.6 | 1.0 |
| 1 | 11087.6 | 11087.6 | 11072.0 | 1.0 |
| 2 | 11110.4 | 11110.9 | 11086.1 | 1.0 |
| 4 | 11143.2 | 11162.8 | 11120.6 | 1.0 |
| 8 | 11171.1 | 11119.5 | 11156.5 | 1.0 |
| 16 | 11236.4 | 11169.2 | 11230.3 | 1.0 |
| 32 | 11459.0 | 11366.2 | 11449.4 | 1.0 |
| 64 | 11858.5 | 11823.5 | 11916.9 | 1.0 |
| 128 | 12717.1 | 12739.2 | 12829.4 | 1.0 |
| 256 | 14307.6 | 14358.2 | 14466.5 | 1.2 |
| 512 | 16029.5 | 15940.2 | 16005.2 | 1.3 |
| ∞ | | 20616.0 | | 2.4 |
| 1x-per-cycle | | 13698.8 | | 1.0 |
| 2x-per-cycle | | 15248.1 | | 1.0 |
| 4x-per-cycle | | 17452.0 | | 1.0 |

Exemplary Observations of the Exemplary Results

The number of observable known bits can be significantly improved, e.g., by allowing a number of x's to pass through. For example, a budget of 512 can double the observability of design A patterns.

Among the exemplary budget-driven procedures, the prioritized preprocessing procedure can perform better with the smallest budgets, and the exemplary runtime processing algorithm can deliver the best results for the largest budgets. For medium-sized budgets, the exemplary preprocessing procedure can deliver what is believed to be the best results. Further, the exemplary mask data can be computed by executing, e.g., all three exemplary algorithms, and selecting the best one on a case by case basis.

Exemplary time-multiplexed x-canceling MISR utilized alone (m=number of chains, q=16, budget=∞) can result in a test time that is, e.g., 3.4 and 2.4 times the original test time for exemplary designs A and B, respectively. (This particular value for q (e.g., 16) can be chosen to have near-perfect error coverage, which can be compromised by reducing q to lower test time penalty). The exemplary toggle-masking approach utilized as an x-filter for the x-canceling MISR can assist in reducing the test time penalty can deliver various trade-off points for the designers. For perfect observability (e.g., 13815 and 20616 bits for designs A and B), although for the highest test time (e.g., 3.4× and 2.4× of original test time for designs A and B), the x-canceling MISR can be utilized alone without the exemplary x-filtering toggle-masking approach. For no increase in test time but reduced observability (e.g., 3384 and 12829 bits for A and B), the exemplary x-filter with a budget of 128 can be utilized in conjunction with the x-canceling MISR. For a certain increase in the test time (e.g., 1.5 and 1.3 times originals for A and B) and a better observability (e.g., 6024 and 16030 bits for A and B), the budget value can be increased to 512.

The exemplary one-x-per-cycle and exemplary two-x's-per-cycle approaches can pass up to 196 and 392 x's for design A, and 223 and 446 x's for design B. The corresponding exemplary budget-driven toggle-masking approaches can perform better than the per-cycle constrained toggle-masking approaches, as the budget-driven approaches may not be subject any constraints on the resulting distribution of x's. While possibly performing slightly inferior, per-cycle constrained toggle-masking can deliver the advantage of a uniform in-flow of x's into the accompanying MISR.

For exemplary designs A and B, four-x's-per-cycle (e.g., 5463 observed bits) and five-x's-per-cycle (e.g., 17452 observed bits) versions of toggle-masking utilized with shadow registered x-canceling MISR can lead to no increase in test time and can guarantee sufficient time for signature post-processing.

Exemplary System Embodiment

Figure 9:
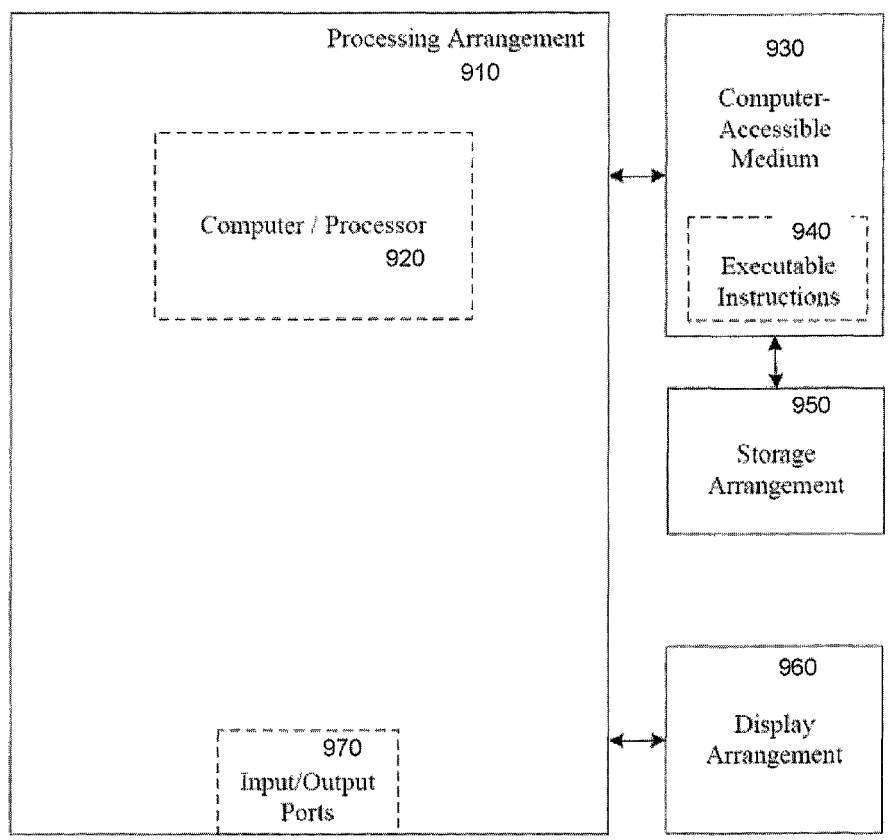
FIG. 9 is an illustration of an exemplary block diagram of an exemplary system in accordance with certain exemplary embodiments of the present disclosure.

FIG. 9 shows an exemplary block diagram of an exemplary embodiment of a system according to the present disclosure. For example, exemplary procedures in accordance with the present disclosure described herein can be performed by a processing arrangement and/or a computing arrangement 902. Such processing/computing arrangement 902 can be, e.g., entirely or a part of, or include, but not limited to, a computer/processor 904 that can include, e.g., one or more microprocessors, and use instructions stored on a computer-accessible medium (e.g., RAM. ROM, hard drive, or other storage device).

As shown in FIG. 9, e.g., a computer-accessible medium 906 (e.g., as described herein above, a storage device such as a hard disk, floppy disk, memory stick, CD-ROM, RAM, ROM, etc., or a collection thereof) can be provided (e.g., in communication with the processing arrangement 902). The computer-accessible medium 906 can contain executable instructions 908 thereon. In addition or alternatively, a storage arrangement 910 can be provided separately from the computer-accessible medium 906, which can provide the instructions to the processing arrangement 902 so as to configure the processing arrangement to execute certain exemplary procedures, processes and methods, as described herein above, for example.

Further, the exemplary processing arrangement 902 can be provided with or include an input/output arrangement 914, which can include, e.g., a wired network, a wireless network, the internet, an intranet, a data collection probe, a sensor, etc. As shown in FIG. 9, the exemplary processing arrangement 902 can be in communication with an exemplary display arrangement 912, which, according to certain exemplary embodiments of the present disclosure, can be a touch-screen configured for inputting information to the processing arrangement in addition to outputting information from the processing arrangement, for example. Further, the exemplary display 912 and/or a storage arrangement 910 can be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. It should be understood that the exemplary procedures described herein can be stored on any computer accessible medium, including a hard drive, RAM, ROM, removable disks, CD-ROM, memory sticks, etc., and executed by a processing arrangement and/or computing arrangement which can be and/or include a hardware processors, microprocessor, mini, macro, mainframe, etc., including a plurality and/or combination thereof. In addition, certain terms used in the present disclosure, including the specification, drawings and claims thereof, can be used synonymously in certain instances, including, but not limited to, e.g., data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

What is claimed is:

1. A non-transitory computer-accessible medium for toggle-based masking of at least one scan chain including instructions thereon that are accessible by a processing arrangement, wherein, when the processing arrangement executes the instructions, the processing arrangement is configured to:
obtain previous masking information regarding the at least one scan chain associated with a previous cycle; and
mask the at least one scan chain for a present cycle based on the previous masking information.

2. The computer-accessible medium of claim 1, wherein the processing arrangement is further configured to change the masking of the at least one scan chain, and while maintaining the masking of all other scan chains of the at least one scan chain.

3. The computer-accessible medium of claim 2, wherein the processing arrangement is further configured to change the masking of at most one scan chain in the present cycle.

4. The computer-accessible medium of claim 2, wherein the processing arrangement is further configured to change the masking of at most two scan chains in the present cycle.

5. The computer-accessible medium of claim 2, wherein the processing arrangement is further configured to change the masking of at most three scan chains in the present cycle.

6. The computer-accessible medium of claim 1, further comprising a decoding arrangement which is configured to receive an address associated with each scan chain for which the masking is to be changed.

7. The computer-accessible medium of claim 1 wherein the processing arrangement is further configured to:
analyze a distribution of at least one unknown bit in a response pattern; and
perform the masking by masking the at least one unknown bit and a subset of known bits.

8. The computer-accessible medium of claim 7, wherein the processing arrangement is further configured to minimize a number of masked known bits.

9. The computer-accessible medium of claim 8, wherein the minimization procedure is performed by the processing arrangement using linear programming.

10. The computer-accessible medium of claim 8, wherein the minimization procedure is performed by the processing arrangement using at least one integer linear programming technique (ILP).

11. The computer-accessible medium of claim 10, wherein the ILP is configured such that a number of scan chains selected includes a maximum number of scan chains.

12. The computer-accessible medium of claim 10, wherein the ILP is configured to mask at least one unknown bit.

13. The computer-accessible medium of claim 10, wherein the ILP is configured to mask all unknown bits.

14. The computer-accessible medium of claim 10, wherein the ILP includes an optimization criterion configured to minimize the number of masked known bits.

15. The computer-accessible medium of claim 8, wherein the minimization procedure is performed by the processing arrangement using a greedy procedure.

16. The computer-accessible medium of claim 15, wherein the greedy procedure includes masking all unknown bits.

17. The computer-accessible medium of claim 16, wherein the greedy procedure includes iteratively selecting and masking at least one known bit to satisfy a constraint of selecting at most a maximum number of scan chains in a cycle.

18. The computer-accessible medium of claim 16, wherein the known bits selected by the greedy procedure is configured to maximally reduce decision changes from one cycle to a next cycle.

19. The computer-accessible medium of claim 15, wherein the processing arrangement is further configured to:
prior to using the greedy procedure, allowing at least one lonely-x to pass, the at least one lonely-x selected from among a plurality of lonely-x's based at least in part on a quantity of toggles associated with the at least one lonely-x.

20. The computer-accessible medium of claim 19, wherein the processing arrangement is configured to allow the at least one lonely-x to pass until a pre-determined x-budget is reached.

21. A system for toggle-based masking of at least one scan chain, comprising:
a non-transitory computer-accessible medium including instructions thereon that are accessible by a processing arrangement, wherein, when the processing arrangement executes the instructions, the processing arrangement is configured to:
obtain previous masking information regarding the at least one scan chain associated with a previous cycle; and
mask the at least one chain for a present cycle based on the previous masking information.

22. A method for toggle-based masking of at least one scan chain, comprising:
obtaining previous masking information regarding the at least one scan chain associated with a previous cycle; and
masking, with a processing arrangement, the at least one chain for a present cycle based on the previous masking information.

* * * * *